United States Patent [19]

Gomi

[11] Patent Number: 5,451,812

[45] Date of Patent: Sep. 19, 1995

[54] LEADFRAME FOR SEMICONDUCTOR DEVICES

[75] Inventor: Yoshihiko Gomi, Suwa, Japan

[73] Assignee: Seiko Epson Corporation, Tokyo, Japan

[21] Appl. No.: 361,010

[22] Filed: Dec. 21, 1994

Related U.S. Application Data

[63] Continuation of Ser. No. 954,833, Sep. 30, 1992, abandoned.

[30] Foreign Application Priority Data

Oct. 2, 1991 [JP] Japan .................. 3-255430

[51] Int. Cl.⁶ .............. H01L 23/48; H01L 29/44; H01L 29/52; H01L 29/60
[52] U.S. Cl. .................. 257/666; 257/670; 257/676; 257/734; 257/784
[58] Field of Search ............. 257/734, 784, 787, 668, 257/666, 676, 670, 672, 692, 784

[56] References Cited

U.S. PATENT DOCUMENTS

| | | | |
|---|---|---|---|
| 3,698,082 | 10/1972 | Hyltin et al. | 29/624 |
| 4,027,326 | 5/1977 | Kummer et al. | 257/666 |
| 4,092,664 | 5/1978 | Davis, Jr. | 357/80 |
| 4,403,240 | 9/1983 | Seki et al. | 257/503 |
| 4,567,643 | 2/1986 | Drouget et al. | 29/575 |
| 4,979,016 | 12/1990 | Lee | 357/70 |
| 5,089,878 | 2/1992 | Lee | 257/666 |
| 5,115,298 | 5/1992 | Loh | 357/70 |
| 5,168,368 | 12/1992 | Gow, 3rd et al. | 257/666 |
| 5,196,725 | 3/1993 | Mita et al. | 257/666 |
| 5,220,195 | 6/1993 | McShane et al. | 257/666 |

FOREIGN PATENT DOCUMENTS

| | | |
|---|---|---|
| 61-148854 | 7/1986 | Japan . |
| 164347 | 3/1989 | Japan . |
| 666351 | 8/1994 | Japan . |

*Primary Examiner*—Rolf Hille
*Assistant Examiner*—T. M. Arroyo
*Attorney, Agent, or Firm*—Harold T. Tsiang

[57] ABSTRACT

A leadframe for semiconductor devices is disclosed. The leadframe includes a die pad supported on the leadframe. A semiconductor chip is mounted on the die pad. The chip has a plurality of pads including at least one group of designated pads for communicating an identical signal, such as a power supply signal of the same level, with external circuits. A terminal on the leadframe is coupled to the group of designated pads. The terminal is attached to selected one or more leads on the leadframe for communicating the identical signal with the external circuits. The other pads on the chip, such as signal pads, are coupled to the corresponding leads on the leadframe. Thus, the total number of leads on the leadframe is reduced and more leads are available for the signal pads, resulting in efficient connections between the chip pads and the leads. Further, wires can be more freely drawn from the chip pads to the leads, resulting in better connections between the pads and the leads and better support for the wires by the leads.

14 Claims, 7 Drawing Sheets

LEADFRAME FOR SEMICONDUCTOR DEVICES

This is a continuation of copending application Ser. No. 07/954,833 filed Sep. 30, 1992, abandoned.

BACKGROUND OF THE INVENTION

This invention relates to a leadframe for semiconductor devices. In particular, it relates to a leadframe that provides for efficient connections between a semiconductor chip including pads for identical signals, such as power supply signals, and the leads on the leadframe.

FIG. 7 shows one-fourth of a unit of a prior art leadframe 37 for a semiconductor device. A semiconductor chip 38 is attached to a die pad 40 on the leadframe. The chip has a plurality of pads 39, some of which are coupled to leads 41 on a one-to-one basis by wires 42. As shown, 10 pads of the chip are coupled to the corresponding 10 leads of the leadframe. There are 5 unused pads on the chip.

In the prior art described above, to properly mount a semiconductor chip on the leadframe, the number of leads on the leadframe must be the same as or greater than the number of pads on the chip, even if the chip includes a number of pads for coupling to an identical signal, such as a power supply signal of the same voltage level. In other words, the number of leads on the leadframe required for coupling to the chip is solely determined by the number of pads on the chip rather than by the types of signals to which a number of the pads may be coupled, such as power supply signals or other signals. This is because each lead on the leadframe can be coupled to at most two pads. Thus, the leadframe and the chip have to accommodate one another, causing an increase in the sizes of leadframes and the chips, and an increase in costs as well as complications in the preparation of leadframes. Moreover, the prior art leadframe described above requires significantly more leads when the chip includes many groups of pads for coupling, respectively, to different types of identical signals, such as high and low voltage pads, and input and output signal pads. As a result, the physical size of the manufactured semiconductor devices may be enlarged because chips with a given number of functions may have to be mounted on a much larger leadframe with more leads. Thus, the prior art technology goes against the general trend of the industry for light weight and small size. Further, it increases costs and makes the manufactured semiconductor devices significantly less competitive.

SUMMARY OF THE INVENTION

The present invention is a leadframe that provides for efficient connections between a semiconductor chip including pads for identical signals, such as power supply signal, and the leads on the leadframe. The invention reduces the leads required for attaching to a semiconductor chip on the leadframe to a minimum number. The invention takes into consideration the types of signals to which a number of pads on the chip may be coupled, such as power supply signals of the same levels and the input and output signals of the same types.

The leadframe of the present invention is for mounting thereon a semiconductor chip which has a plurality of pads including at least one group of designated pads for communicating an identical signal with external circuits.

According to one aspect of the invention, the leadframe includes a die pad supported on the leadframe for supporting the chip.

According to another aspect of the invention, the leadframe has a plurality of leads for coupling the plurality of pads of the chip to external circuits, with a selected number of the leads supporting the die pad.

According to a further aspect of the invention, the leadframe includes at least one terminal which is attached to at least one selected lead and is for coupling to the group of designated pads for communicating the identical signal with the external circuits. Thus, the terminal may either receive an identical signal, such as a power supply signal of the same level, from the external circuits, or transmit an identical signal to the external circuits. The terminal and the attached lead may be an integral unit or they may be made of different materials and attached together by conductive adhesive.

In an alternative embodiment, the leadframe includes a plurality of terminals coupled together by terminal connectors along the die pad, with each terminal for coupling to a corresponding group of designated pads of the chip for communicating a respective identical signal with the external circuits. The terminal connectors may be made of a conductive material or a non-conductive material, or some selected terminal connectors may be made conductive. Thus, the terminals can be coupled in various ways for various purposes.

Accordingly, a semiconductor chip with a number of functions may be mounted on the leadframe with a given number of leads. Additionally, because the number of leads required for the power supply decreases, wires can be more freely extended from the pads of the chip to the leads. As a result, wires that connect most pads to the assigned leads can be extended substantially in parallel with the leads. Consequently, better electrical connections between the pads and the leads and better support for the wires by the leads can be achieved.

The above and other features and advantages of the invention will become more apparent from the following description taken in conjunction with the accompanying drawings.

DESCRIPTION OF THE PREFERRED EMBODIMENTS

Figure 1:
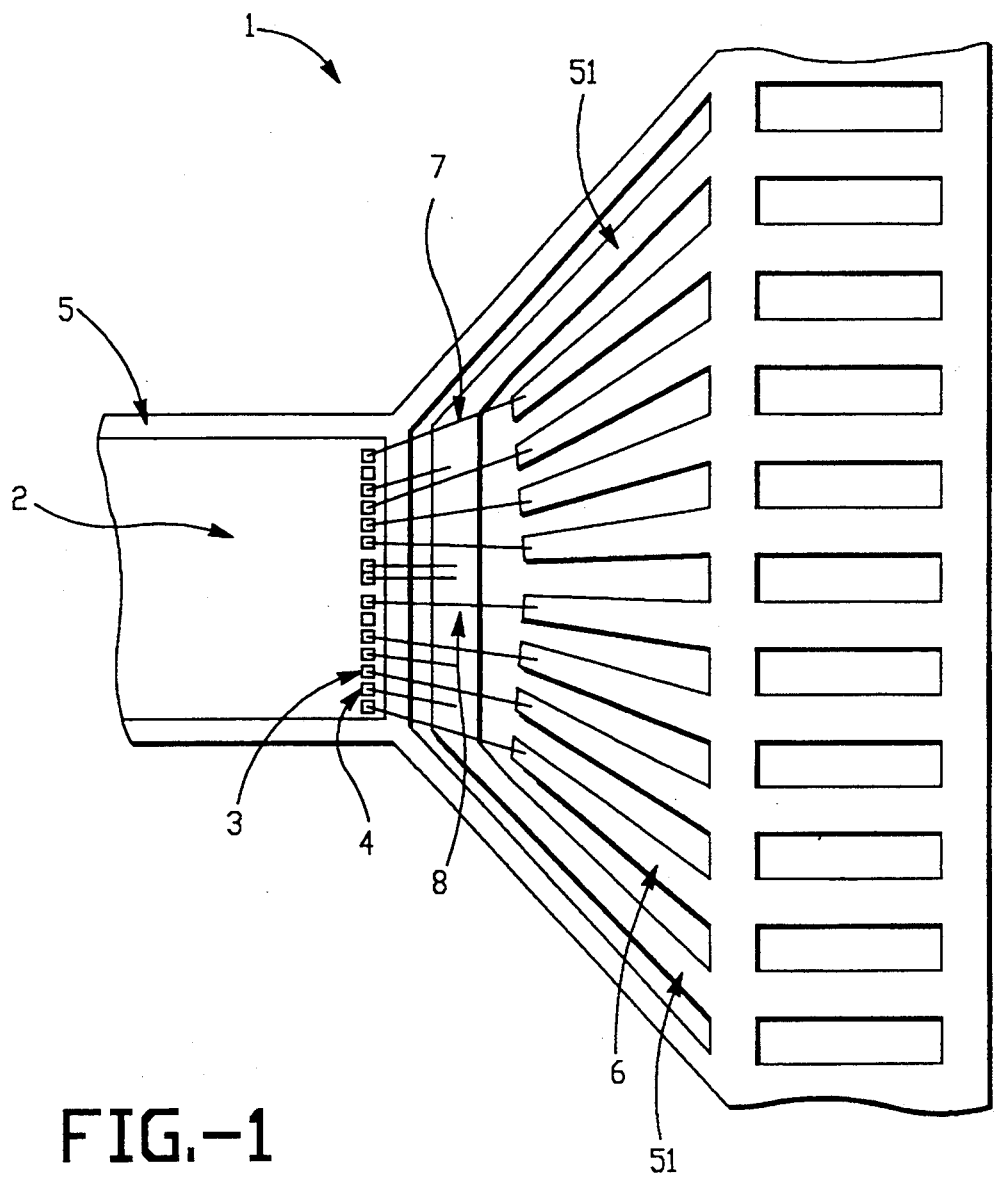
FIG. 1 illustrates a portion of a leadframe according to a first embodiment of the invention in which a metal terminal and two leads at its ends are an integral unit.

FIG. 1 illustrates one-fourth of a unit of a leadframe 1 for a semiconductor device according to a first embodiment of the invention. A semiconductor chip 2 is attached to a die pad 5 which supports the chip on the leadframe. The chip has eight signal pads 3 coupled to eight corresponding leads 6 on the leadframe via wires 7. Leads 6 are for coupling to external circuits for data communication. The chip also has five power supply pads 4 coupled to a metal terminal 8 positioned between the die pad and the leads on the leadframe via wires 7. The five power supply pads that are coupled to metal terminal 8 are essentially coupled to two leads 51 which are connected to the two ends of metal terminal 8. Leads 51 are for coupling to an external power supply signal of the same level. Thus, the thirteen pads of the chip are coupled to only ten leads, resulting in a reduction of three leads. In this first embodiment, metal terminal 8 and two leads 51 at its ends are an integral unit, which reduces the manufacturing costs of the leadframe. The metal terminal and the two leads at its ends may be made of different materials and connected together as will described below.

Figure 2:
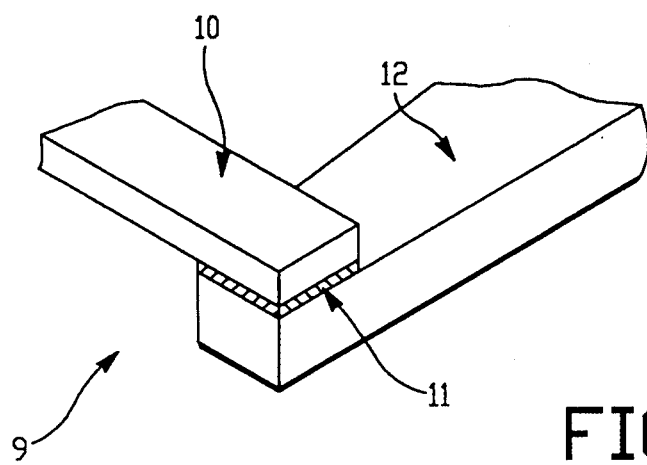
FIG. 2 shows a junction formed by attaching a metal terminal to a lead at its one end using conductive adhesive.

FIG. 2 shows a junction formed by connecting a metal terminal 10 to a lead 12 at its one end according to the invention. As shown, the metal terminal is attached to the upper surface of the lead by conductive adhesive 11. Alternatively, the lower surface or a side surface of the lead may be used for attaching to the metal terminal. The method of attaching may also be accomplished in other ways, such as resistance welding.

Figure 3:
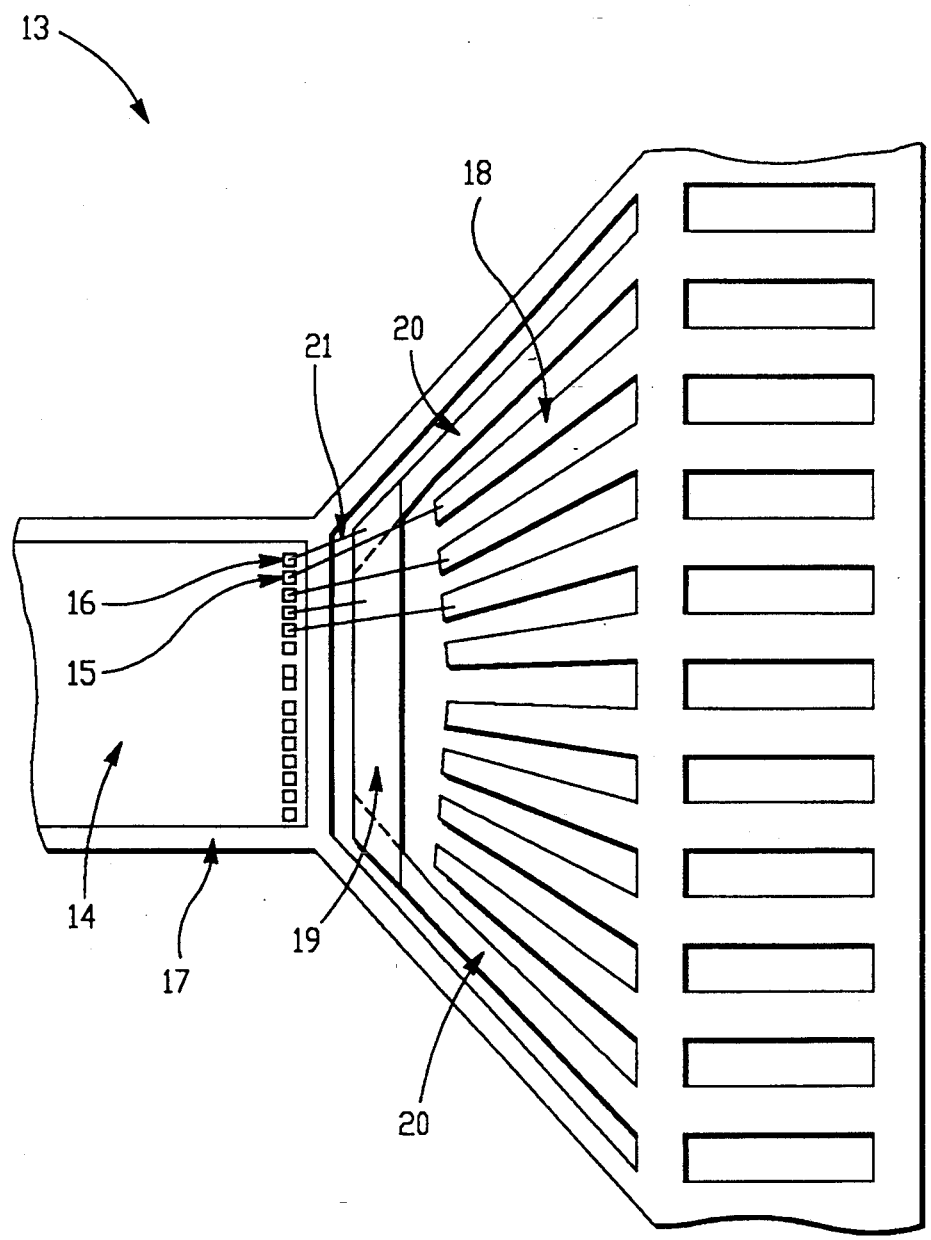
FIG. 3 illustrates a portion of a leadframe according to a second embodiment of the invention in which a metal terminal and two leads at its ends are attached in the manner shown in FIG. 2.

FIG. 3 illustrates one-fourth of a unit of a leadframe 13 for a semiconductor device according to a second embodiment of the invention. A semiconductor chip 14 is attached to a die pad 17, which supports the chip on the leadframe. The chip has signal pads 15 coupled to leads 18 which are for coupling to external circuits for data communication. The chip also includes power supply pads 16 coupled to a metal terminal 19 positioned between the die pad and leads 18 via wires 21. The metal terminal is attached to two leads 20 at its two ends. Leads 20 extend farther toward the die pad than leads 18 and are for coupling to an external power supply signal of the same level. This second embodiment is similar to that shown in FIG. 1, except that metal terminal 19 and two leads 20 at its two ends are attached together in the manner shown in FIG. 2.

Figure 4:
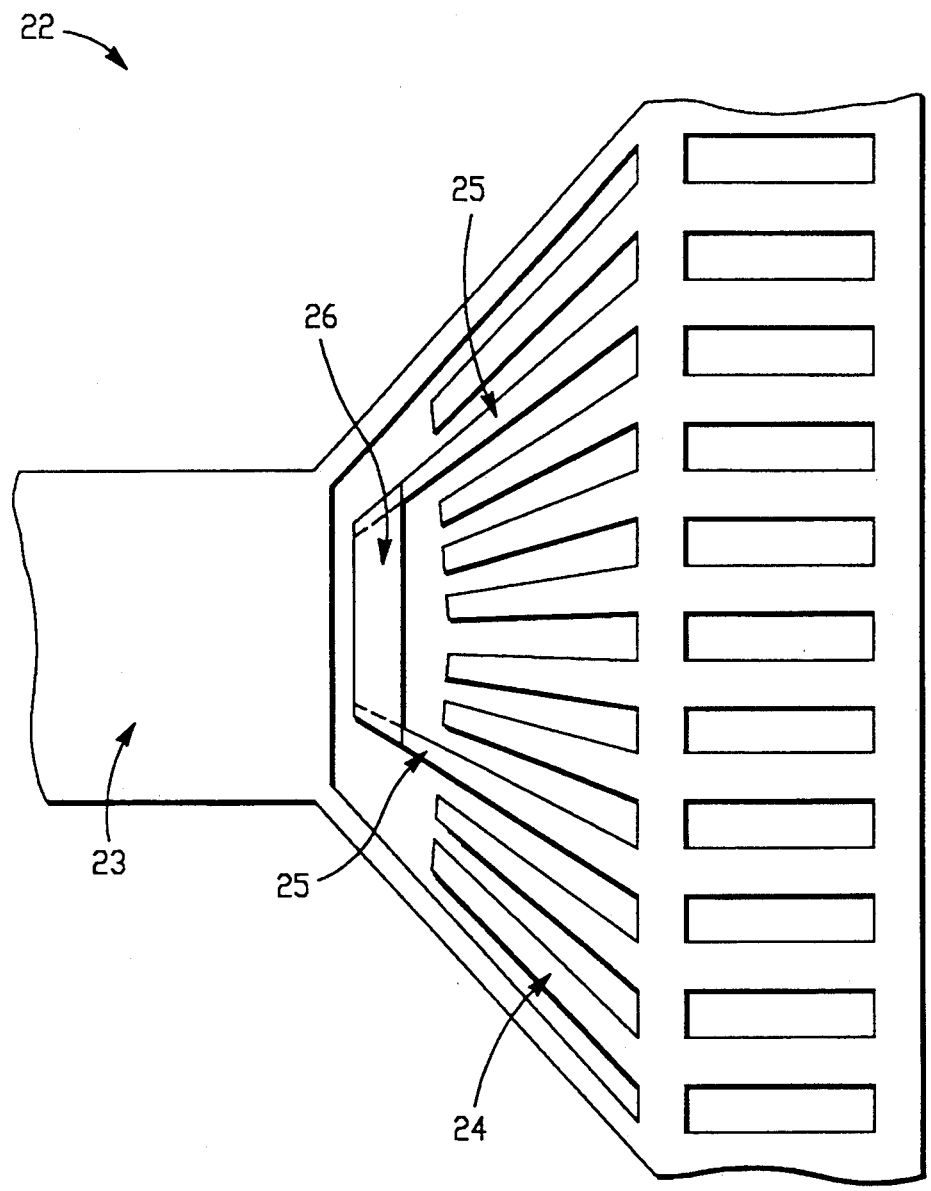
FIG. 4 illustrates a portion of a leadframe according to a third embodiment of the invention in which a metal terminal of a relatively small size is attached to two selected leads.

FIG. 4 illustrates one-fourth of a unit of a leadframe 22 according to a third embodiment of the invention. The leadframe includes a die pad 23 for supporting a semiconductor chip thereon and leads 24 for coupling to external circuits for data communication. The leadframe also includes a metal terminal 26 of a relatively small size positioned between the die pad and leads 24. The metal terminal is attached to two selected leads 25 at its two ends. Leads 25 are selected from among leads 24 and are for coupling to an identical signal, such as an external power supply signal of the same level. It is apparent that the metal terminal may be attached to any of leads 24. In FIG. 4, leads 25 are attached to metal terminal 26 in the manner shown in FIG. 2. However, metal terminal 26 and two leads 25 at its two ends may be an integral unit.

Figure 5:
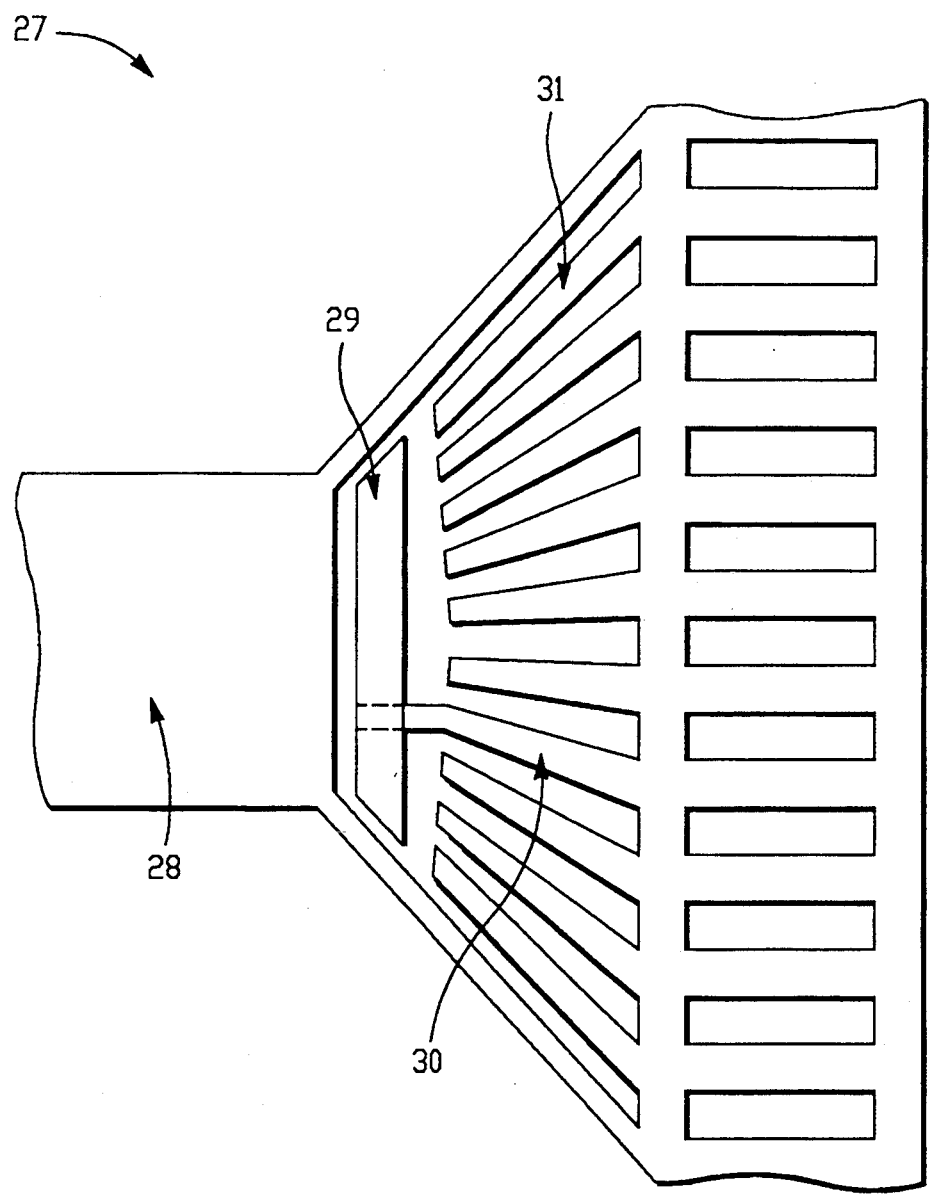
FIG. 5 illustrates a portion of a leadframe according to a fourth embodiment of the invention in which a metal terminal is attached only to a selected lead.

FIG. 5 illustrates one-fourth of a unit of a leadframe 27 according to a fourth embodiment of the invention. The leadframe includes a die pad 28 for supporting a semiconductor chip thereon and leads 31 for coupling to external circuits for data communication. The leadframe also includes a metal terminal 29 positioned between the die pad and leads 31. As shown, the metal terminal is attached to only one lead, i.e., lead 30. Lead 30 is selected from among leads 31 and is for coupling to an identical signal, such as an external power supply signal of the same level. As is apparent from FIG. 5, the metal terminal may be attached to any one of leads 31. Further, the area on the metal terminal on which the lead is attached may be at any desired location. In FIG. 5, lead 30 is attached to metal terminal 29 in the manner shown in FIG. 2. However, the metal terminal and the connected lead may be an integral unit.

Figure 6A:
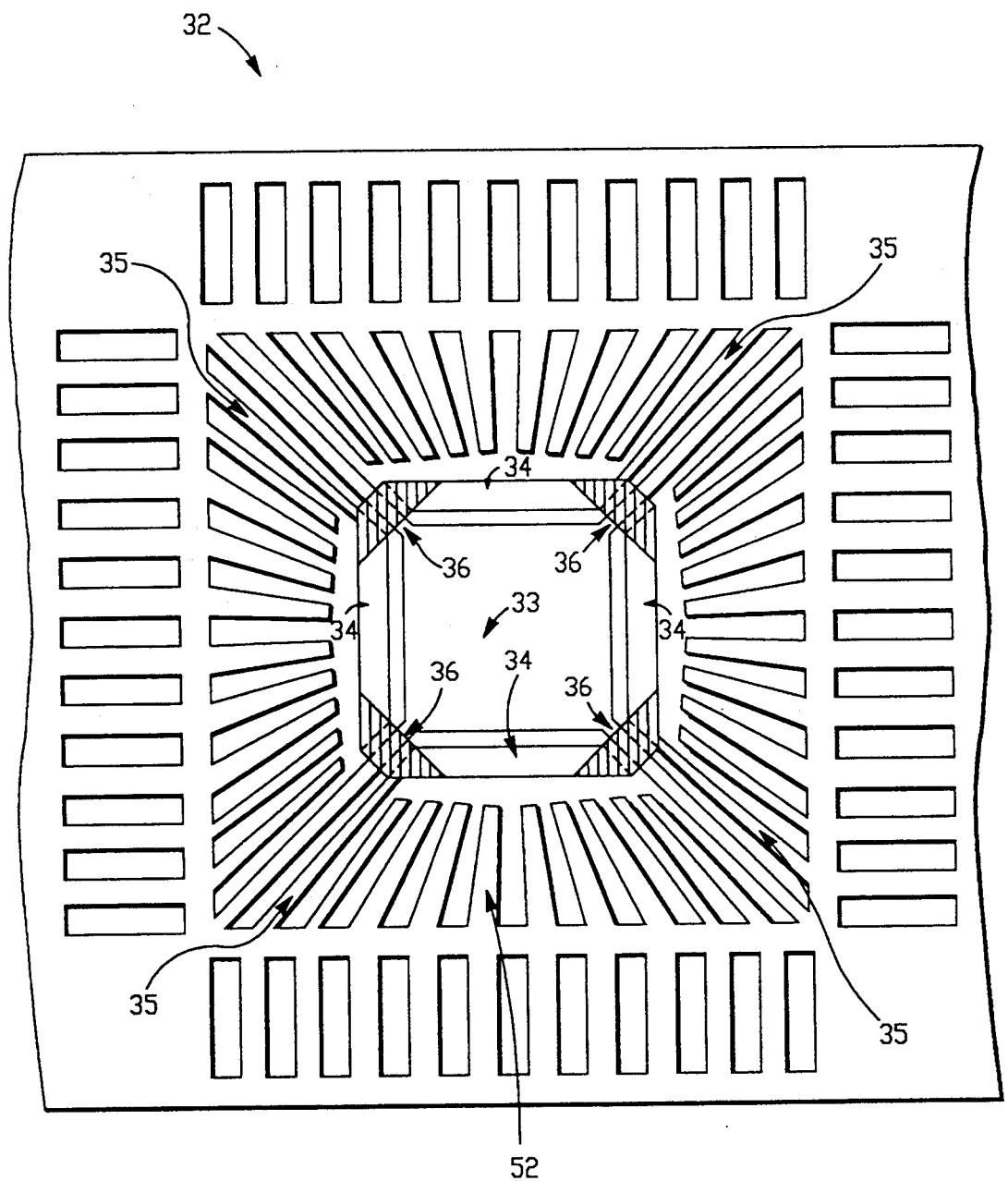
FIG. 6A shows a complete unit of a leadframe according to the invention in which four metal terminals are connected together around a die pad by terminal connectors.

FIG. 6A shows a complete unit of a leadframe 32 according to the invention. The leadframe includes a die pad 33 for supporting a semiconductor chip thereon and leads 52 for coupling to external circuits for data communication. The leadframe also includes four metal terminals 34 coupled together along the die pad by terminal connectors, such as plates 36. Each metal terminal is attached to a respective lead 35 at its one end. Each metal terminal and the respective attached lead may be an integral unit. Leads 35 are selected from among leads 52 and are for coupling to respective identical signals, such as external power supply signals of the same levels or other signals of the same types. From FIG. 6, it is apparent that each metal terminal may be attached to any number of leads 52. Further, if terminal connectors 36 are made of a conductive material, all metal terminals 34 will be electrically coupled together. On the other hand, if terminal connectors 36 are made of a non-conductive material, all metal terminals 34 will be electrically isolated from one another. Further, in other cases only selected terminal connectors may be made of a conductive material. Thus, the metal terminals can be coupled in various ways for various purposes.

Figure 6B:
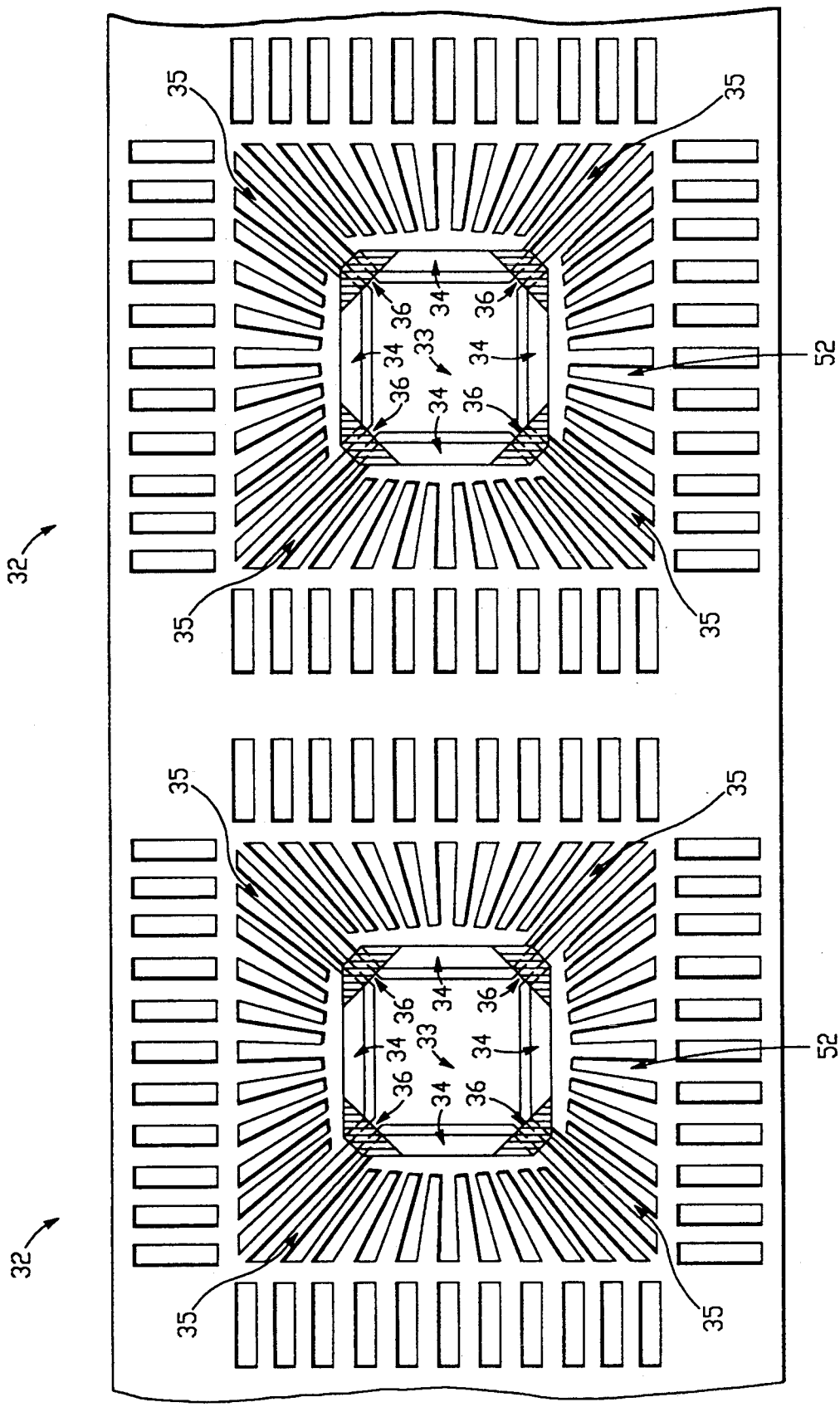
FIG. 6B shows two complete units of a leadframe according to the invention.
Figure 7:
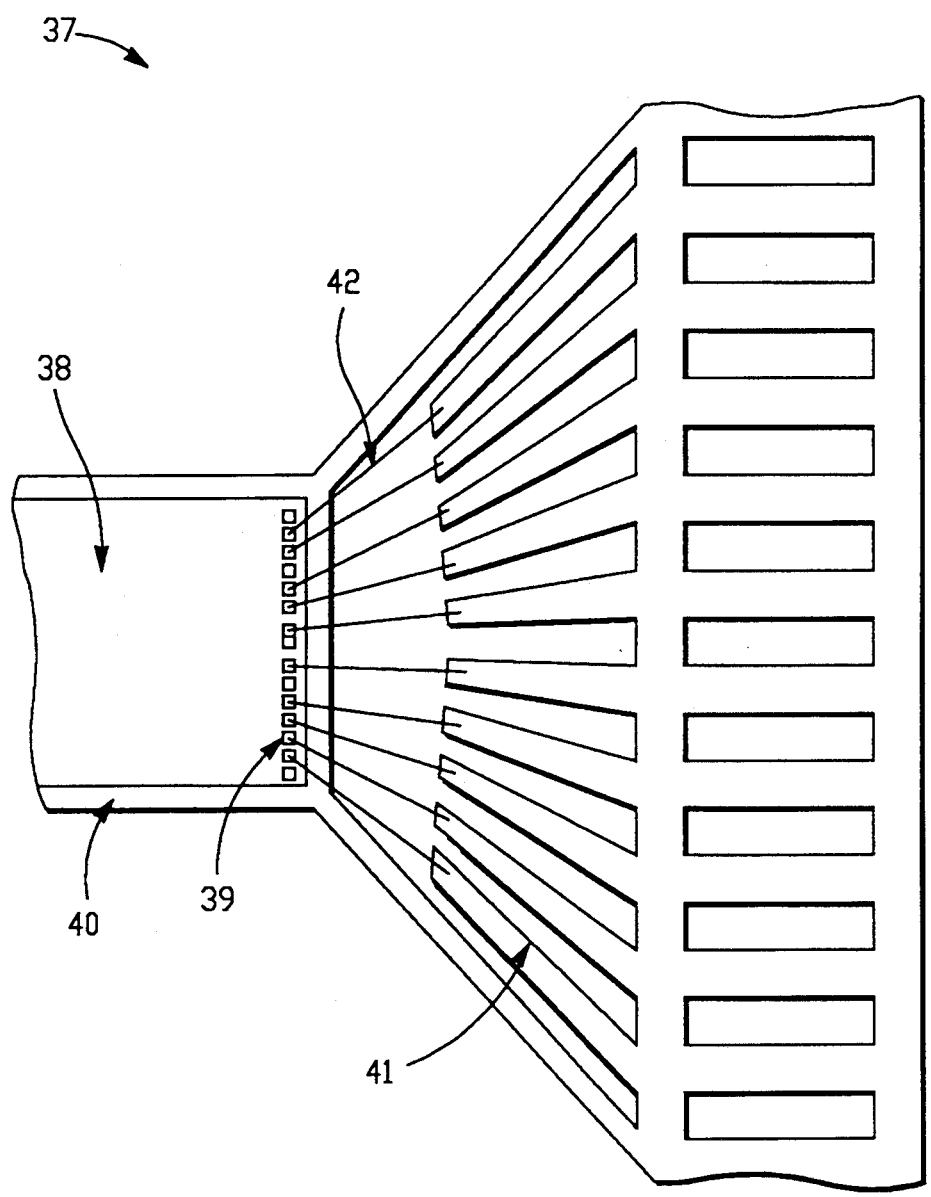
FIG. 7 shows a portion of a prior art leadframe.

FIG. 6B shows two complete units of the leadframe according to the invention. Each unit is identical to the one in FIG. 6A.

While the invention has been described in conjunction with several specific embodiments of the invention, it is evident to those skilled in the art that many further alternatives, modifications and variations will be apparent in light of the foregoing description. For example, the number of the metal terminals may be more or less than those shown in the drawings. Further, the leads attached to the metal terminals may be more or less than those shown. Additionally, the metal terminals and the terminal connectors may have different shapes. Thus, the invention described herein is intended to embrace all such alternatives, modifications, applications and variations as may fall within the spirit and scope of the appended claims.

What is claimed is:

1. A leadframe for mounting thereon a semiconductor chip which has a plurality of bonding pad means positioned along at least one side of the chip and including a plurality of groups of designated bonding pad means, with each group of designated bonding pad means for communicating an identical signal with external circuits, the leadframe comprising:

a frame having support means and a plurality of lead means for coupling the plurality of bonding pad means of the chip to the external circuits;

mount means, positioned within said frame and attached to said support means, for supporting the chip; and a plurality of terminal means, with each terminal means, positioned between one side of said mount means and one end of at least some of said plurality of lead means and attached to at least one selected lead means, for coupling to an associated group of designated bonding pad means of the chip for communicating a respective identical signal with the external circuits through said at least one selected lead means; and a plurality of terminal connectors coupling said plurality of terminal means together around said mount means;

wherein said plurality of terminal means and said plurality of lead means are comprised of separate layers.

2. The leadframe of claim 1 wherein said support means includes a plurality of lead means, each of which is attached to one end of each of two adjacent terminal means as said selected lead means.

3. The leadframe of claim 1 wherein a selected number of said terminal means are for coupling to the associated groups of designated bonding pad means for receiving the respective identical signals.

4. The leadframe of claim 1 wherein each terminal means is positioned such that there are a first predetermined space between said terminal means and said side of said mount means and a second predetermined space between said terminal means and said end of said at least some lead means.

5. The leadframe of claim 4 wherein each terminal means has a substantially rectangular shape and is substantially parallel to said side of said mount means and said end of said at least some lead means.

6. The leadframe of claim 1 wherein a selected number of said terminal connectors are made of conductive materials for electrically coupling selected terminal means together.

7. The leadframe of claim 1 wherein all of said terminal connectors are made of non-conductive materials for electrically isolating said terminal means from one another.

8. A leadframe for mounting thereon a semiconductor chip which has a plurality of bonding pad means positioned along four sides of the chip and including a plurality of groups of designated bonding pad means, with each group of designated bonding pad means for communicating an identical signal with external circuits, the leadframe comprising:

a frame having support means and a plurality of lead means for coupling the plurality of bonding pad means of the chip to the external circuits;

mount means, positioned within said frame and attached to said support means, for supporting the chip, said mount means having four sides; and four terminal means, with each terminal means, positioned between one side of said mount means and one end of at least some of said plurality of lead means and attached to at least one selected lead means, for coupling to an associated group of designated bonding pad means of the chip for communicating a respective identical signal with the external circuits through said at least one selected lead means; and four terminal connectors each coupling two adjacent terminal means together at a corner of said mount means;

wherein said four terminal means and said four lead means are comprised of separate layers.

9. The leadframe of claim 8 wherein said support means includes a plurality of lead means, each of which is attached to one end of each of two adjacent terminal means as said selected lead means.

10. The leadframe of claim 8 wherein a selected number of said terminal means are for coupling to the associated groups of designated bonding pad means for receiving the respective identical signals.

11. The leadframe of claim 8 wherein each terminal means is positioned such that there are a first predetermined space between said terminal means and said side of said mount means and a second predetermined space between said terminal means and said end of said at least some lead means.

12. The leadframe of claim 11 wherein each terminal means has a substantially rectangular shape and is substantially parallel to said side of said mount means and said end of said at least some lead means.

13. The leadframe of claim 8 wherein a selected number of said terminal connectors are made of conductive materials for electrically coupling selected terminal means together.

14. The leadframe of claim 8 wherein all of said terminal connectors are made of non-conductive materials for electrically isolating said terminal means from one another.

* * * * *